United States Patent [19]

Kelly et al.

[11] Patent Number: 4,574,235
[45] Date of Patent: Mar. 4, 1986

[54] TRANSMISSION LINE CONNECTOR AND CONTACT SET ASSEMBLY FOR TEST SITE

[75] Inventors: Thomas C. Kelly, White Bear Lake; Robert J. Wurscher, Shoreview; Dennis M. Petrich, Wayzata; Earl H. Rideout, Coon Rapids, all of Minn.

[73] Assignee: Micro Component Technology, Inc., Shoreview, Minn.

[21] Appl. No.: 270,709

[22] Filed: Jun. 5, 1981

[51] Int. Cl.[4] .................. G01R 31/02; G01R 1/06
[52] U.S. Cl. ........................... 324/158 F; 324/158 P
[58] Field of Search ............ 324/158 F, 158 P, 72.5, 324/73 AT, 73 PC

[56] References Cited

U.S. PATENT DOCUMENTS 3,405,361 10/1968 Kattner et al. ................. 324/158 P

OTHER PUBLICATIONS

Printed Circuit Layouts; brochure from Rucker & Kolls, Mountain View, Calif. 94040; Mar. 25, 1974; pp. 1-6.

Primary Examiner—Ernest F. Karlsen
Attorney, Agent, or Firm—Lawrence M. Nawrocki

[57] ABSTRACT

A transmission line connector for a contact set assembly for making contacts to contact elements of electrical devices, such as IC devices including DIPs and LCCs, affords a controlled impedance path between the contact elements of a device to be contacted and remote terminal ends of the respective transmission line conductors. The connector may be flexible or rigid. An actuating mechanism engages the connector adjacent the opposite end edges thereof for urging probe elements attached to the respective end terminals of the respective plurality of conductive lines into engagement with corresponding contact elements of the device to be contacted. A flexible transmission line connector permits rapid and continuous actuation of the actuating device between a normal disengaged position and an engaged position for making contact. The controlled impedance transmission line conductor is adaptable for providing contact to a wide range of device as to size and configuration, and as to number and location of contacts.

23 Claims, 24 Drawing Figures

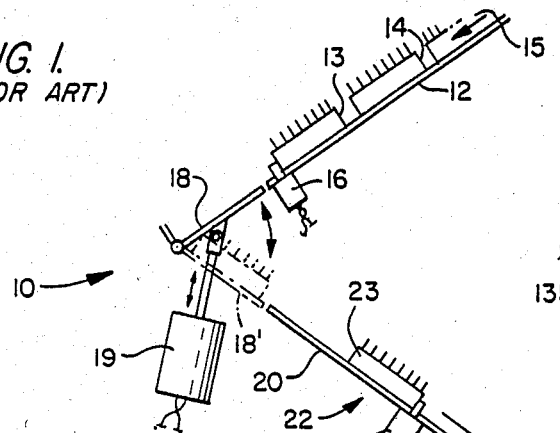
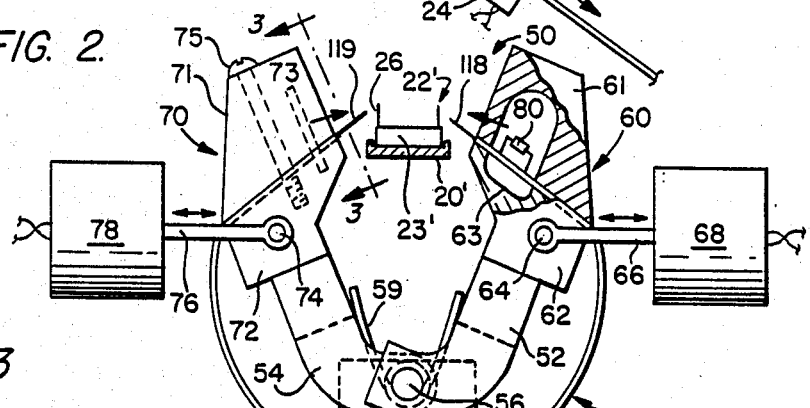
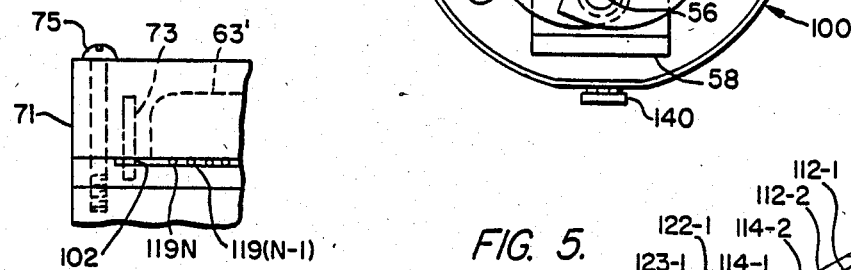
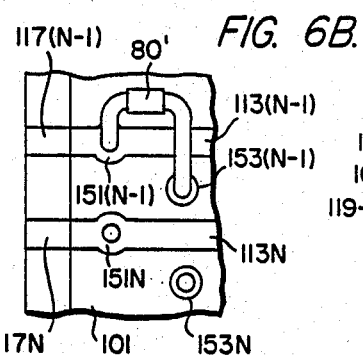
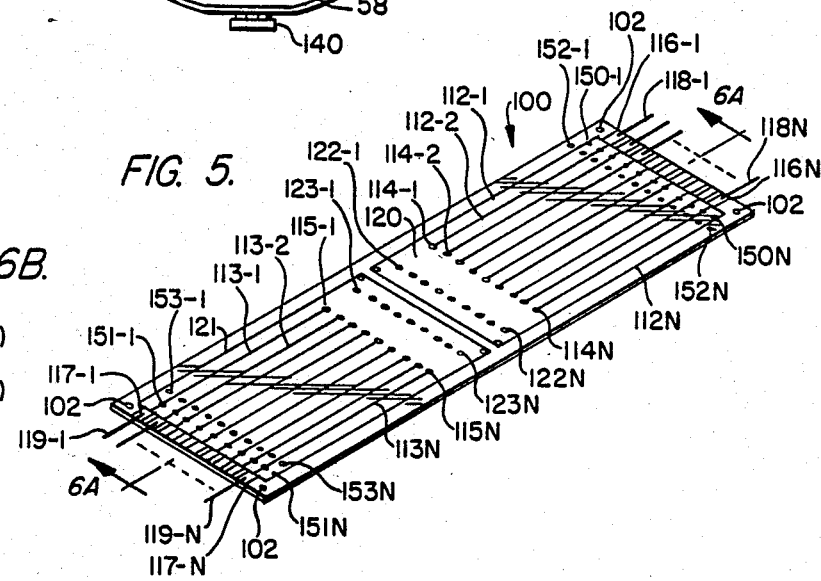
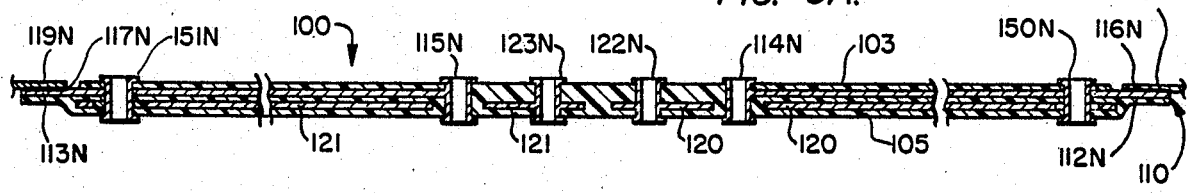

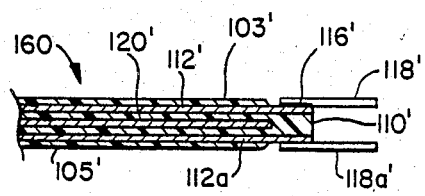
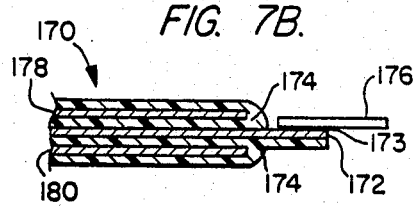
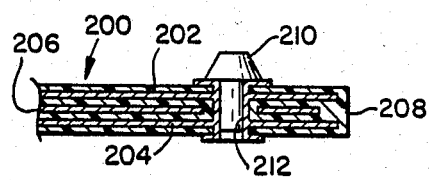
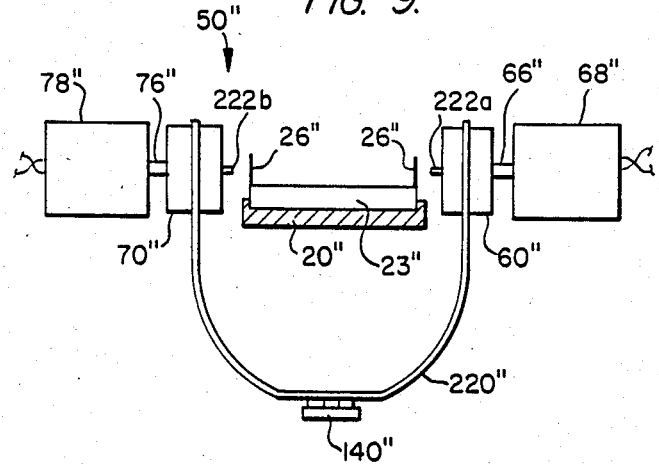
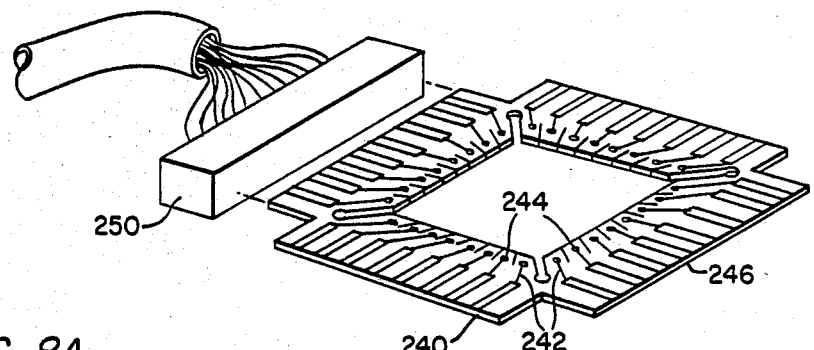
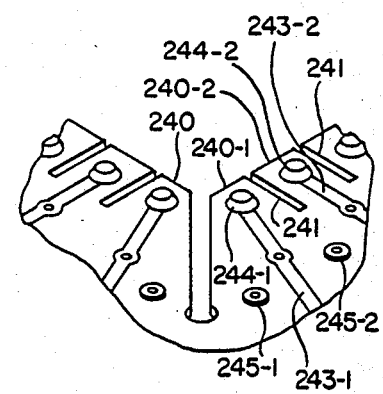
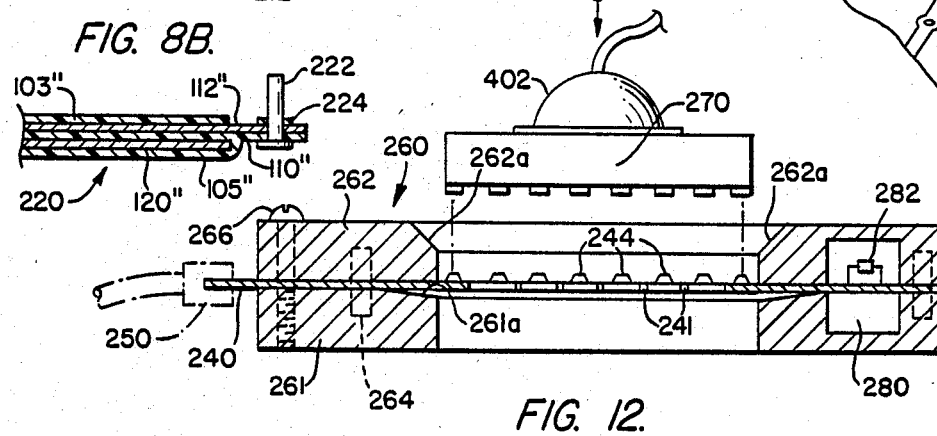

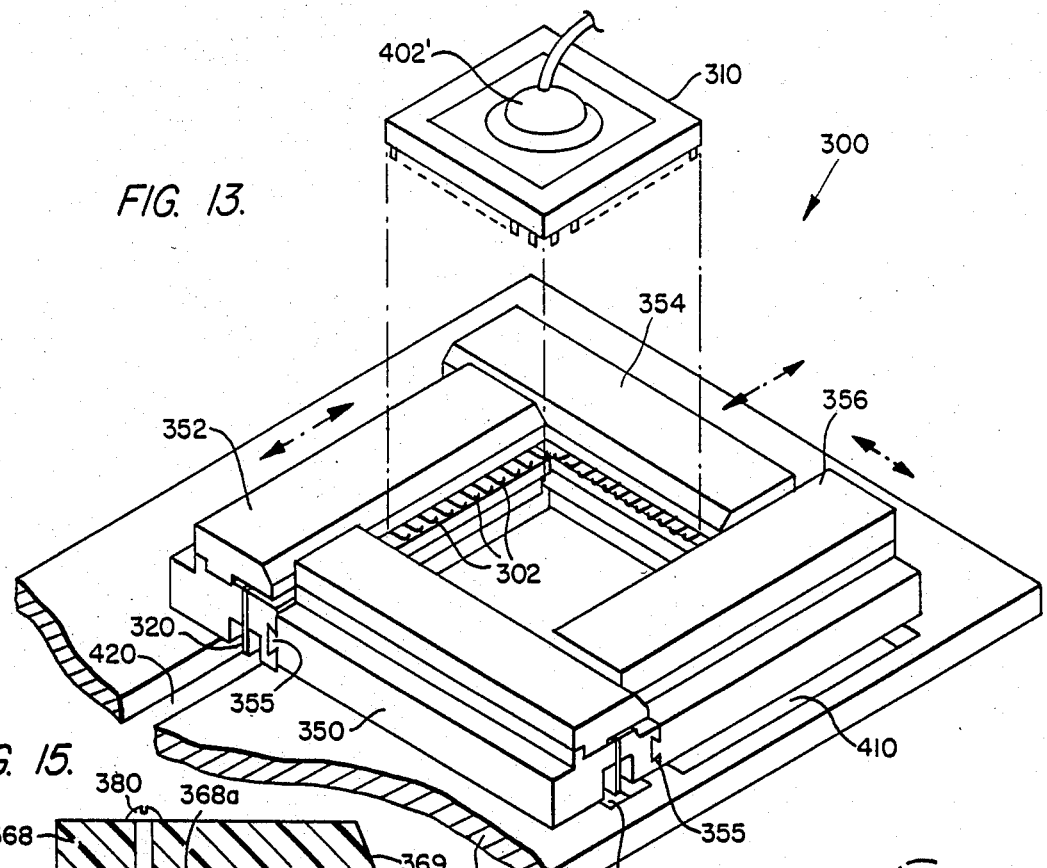
FIG. 13.
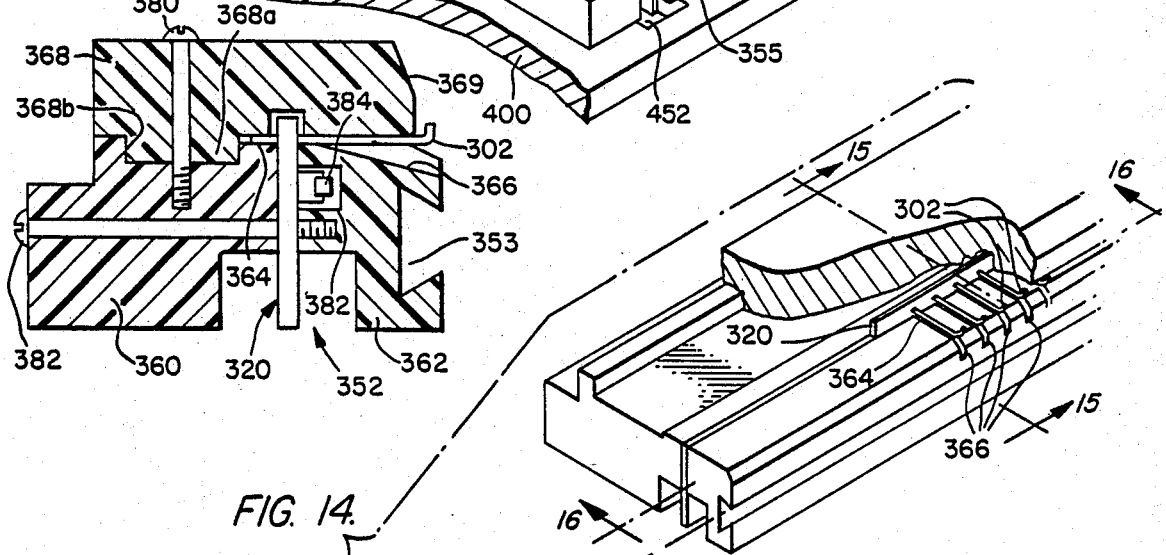
FIG. 15.
FIG. 14.
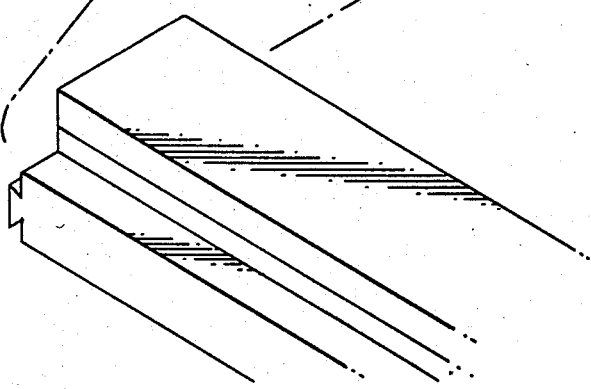

TRANSMISSION LINE CONNECTOR AND CONTACT SET ASSEMBLY FOR TEST SITE

CROSS-REFERENCE TO RELATED APPLICATION

The application discloses in part the invention of a concurrently filed application entitled "Contact Set Assembly for Test Site Employing Transmission Line Connector" in the names of Arlon J. Amundson et al. and commonly assigned herewith.

BACKGROUND OF THE INVENTION

1. Field of the Invention

This invention relates to an improved connector and a contact set assembly employing the improved connector for use in a test site and, more particularly, to an improved contact set assembly for an IC handler, employing a controlled impedance transmission line connector affording improved mechanical and electrical "device-to-test head" contact. The IC (integrated circuit) devices to which the invention relates, but is not limited, include both conventional IC packages such as DIP's (dual-in-line packages) and also higher density packages used in LSI and VLSI technologies and having high pin counts, such as leadless and/or leaded chip carriers (LCC) and small-outline (SO) packages.

2. Description of the Prior Art

IC handlers vary in their construction and design, from manual and/or semi-automatic handlers which provide basic input- and-output movement of devices across a tester head, to sophisticated, essentially fully automated systems which are capable of communicating with a host computer. Sophisticated handlers are capable of handling in excess of 10,000 to 12,000 or more devices per hour with controlled environmental conditions. Handlers may be dedicated to testing of devices of a single predetermined configuration, or adjustable, to accommodate devices of different sizes and configurations.

As has been recognized in the prior art, handlers present a difficult design problem, since they must be easy to operate and of sufficient speed to be economical in a production operation, while solving numerous electrical, thermal, environmental, and mechanical problems necessary to the handling function to enable accurate testing operations. Device-to-test head contact is a major electrical problem. Thermal problems result from the need to cool and heat devices before testing, both rapidly and accurately, to simulate actual operating conditions of the devices (e.g., environmental temperatures from −60° C. to +160° C.). The handler also must withstand other environmental conditions, such as static voltages, humid locations and frost build-up during cold-environment testing operations.

Mechanical problems include the need to achieve high speed operation for any of a variety of package sizes, yet with minimization of wear to the handler parts, and particularly to the probes which make contact to the pins or contact areas of the IC devices.

An example of the general handler function in transporting devices to a test site is illustrated in FIG. 1; the schematically illustrated flow of devices corresponds to that performed in high speed IC handlers manufactured by Micro Component Technology Inc., assignee herein. As schematically shown in FIG. 1, the handler 10 includes a supply trough 12 which supports a plurality of DIP's 13, 14, 15 . . . in a gravity feed position. For this purpose, the feed trough 12 of a commercially available MCT system is at an angle of approximately 35 degrees from the horizontal. A solenoid actuated stop 16 retains the DIP's 13, 14, 15 . . . in the feed position.

A shuttle mechanism 18 is maintained in a normal receiving position, shown in solid lines, for receiving a single DIP from the trough 12 when the solenoid stop 16 is retracted. The shuttle 18 then is rotated by actuator 19 to its dotted line, discharge position 18' in alignment with the output trough 20 to release the DIP carried thereby onto the output trough 20. The trough 20, due to its anglular position of about 35 degrees from the horizontal, effects gravity feed of the DIP down the trough 20 to a test station 22. A solenoid actuated stop 24 stops the DIP 23 when received at the test site 22. Although not shown in FIG. 1, a contact set assembly is mounted at the test site 22; it is actuated when a DIP is positioned at the test site 22 to make contact to the leads or contact pins of the DIP. After testing of the DIP, the solenoid actuated stop 24 is energized and retracted, thereby to release the DIP 23 to continue down the trough 20 to a receiving device, typically a sorter.

DIP's vary in size, typically from 300 to 600 mils in width, and have varying numbers of leads or pins, from as few as 6 pins (three pins on each of the two longer sides, such as on a 300 mil device) to 42 pins (21 pins on each of the two sides such as in a 600 mil device). Typically, the DIP contact pins are separated at 100 mil center line spacings.

The demand for high density packaging has resulted in higher pin count LSI and VLSI technology devices, known as lead-less or leaded chip carriers (LCC's). Such carriers come in a variety of package sizes and configurations with corresponding variations in the number of contacts thereon, such contacts typically being provided on all four sides of the generally rectangular package. Small outline (SO) packages as well present variations in package size and number of contacts.

These variations in sizes, configurations, and types of IC devices have presented substantial problems in the design of appropriate contact set assemblies for the test sites of handlers. Moreover, as the complexity of the IC package increases, along with the emergence of high performance testers for testing the ever more complex IC packages, the need for achieving electrical contact with minimal degradation of the test signals has increased. High performance testers today operate in the 50 to 100 MHz range, imposing stringent requirements on the handler function and particularly as to the device-to-test head contacts. In high speed testing of devices such as ECL (emitter-coupled logic) circuits, high speed TTL (transistor-transistor logic) and even some higher speed MOS (metal oxide semiconductor) circuits, the contacts, if not made properly, and/or if not made through sufficiently short electrical paths, can degrade the test signals to the point of defeating reliable testing of the devices.

A further significant problem is the need to electrically couple or decouple the IC close to the device itself, so as to eliminate both power supply noise and ground noise. Another significant problem is that of impedance matching from the tester to the pin of the integrated circuit. Mismatching causes reflections and ringing and degrades the testing waveform, especially in the case of dynamic parametric tests, severely impacting the capability of high speed testing, such as is required for ECL type signals. A further serious problem is that of cross-talk, and particularly as to noise coupling among the signal lines connecting the pins of the devices to a mother board or other connection associated with the testing equipment.

Prior art contact sets employed in handler test site assemblies fail to address these problems at all, or address them only inadequately. As those with skill in the art appreciate, the inadequate bypassing of prior art devices can cause significant variations in the voltage levels actually applied to the device under test, seriously affecting the capability of testing. Improper impedance matching can result in transients requiring delay intervals for stabilization before testing can be conducted, significantly reducing the through-put rate for testing of sucessive devices. The significance of the speed of testing can be appreciated with regard to testing of a 16K memory (having 16,384 bit memory devices). Transient characteristics created by improper impedance matching require a delay time interval to achieve stabilization prior to test; assuming accurate testing of each memory cell is to be achieved, the time required to conduct the test for a single such memory device thus is increased by a total of over 16,000 such individual delays. Thus, proper impedance matching is critical to achieving transient-free and thus high speed operation for the testing function.

Highly accurate testing also requires a contact set configuration which provides Kelvin contact. Frequently, prior art devices are incapable of affording Kelvin contact, particularly on LCC's.

These and other problems of the prior art test sites, and especially the contact set assemblies employed therein, are overcome by the contact set assembly of the present invention.

SUMMARY OF THE INVENTION

The present invention relates to a controlled impedance transmission line connector for a contact set assembly for the test site of an IC handler, and to contact set assemblies employing such connectors for testing of DIP's. In one embodiment, the transmission line connector comprises an insulating layer having precise metallic traces on one of its surfaces and a substantially continuous conductor plane serving as a ground plane or power plane on the opposite surface thereof, affording thereby a plurality of controlled impedance transmission lines corresponding to the number of connector pins or contacts of an IC device to be contacted. The conductive affords an excellent electrical ground reference for the device under test. In other embodiments, a further insulating layer may be disposed on the generally continuous conductor layer and a further plurality of the precise metallic traces formed on the further insulating layer. In yet other embodiments, the metallic traces may be disposed within an insulating layer and symetrically positioned relative to first and second ground planes disposed on the exposed surfaces of the insulating layer. Thus, connector sets employing controlled impedance transmission lines of either strip line or micro-strip type are contemplated herein. The controlled impedance of the transmission lines may be typically 50 ohms, or other impedance as required. The insulating material of the transmission line connector may be either flexible or rigid, and must withstand the rigorous environmental and mechanical conditions to which the test assembly is subjected in its intended use. A preferred, commercially available material is Kapton ®.

Contact probes are soldered or otherwise secured to connection tabs provided at the extreme, free ends of the traces, for making electrical contact to the contact pins of a DIP or to the contacts of an LCC under test. The contact probes themselves are formed of a material having minimal electrical contact resistance while exhibiting superior mechanical characteristics and, particularly, resistance to abrasion, corrosion and other life-limiting environmental and use factors. A preferred probe material is Paliney No. 7 ®, a homogeneous gold alloy sold by the J. M. Ney Company of Greenfield, Conn.

The transmission line connector may be configured for use in contact set assemblies for testing of DIP's and LCC's of any size, configuration, and number of pins or contacts, whether dedicated to a specific IC device or designed to accommodate a limited range of devices, as to size, number of contacts and configuration, or adjustable to accomodate a wide variety of carrier sizes, contacts, and configurations.

In certain embodiments of contact set assemblies employing transmission line connectors in accordance with the invention, pins are soldered or welded to the opposite ends of the traces for connection to a tester connection board; in still other embodiments, electrical connector tabs are formed on the other ends of the traces and engaged by conventional printed circuit board connectors to complete the connection to the tester.

The transmission line connector of the invention thus may be structured as either a strip line or a micro-strip, and in any of its various embodiments affords a desired, e.g. 50 ohm, impedance transmission line characteristic for proper impedance matching between a tester terminal and the contacts or pins of a device being tested. It minimizes cross-talk by virtue of affording a continuous ground plane, and affords convenient mounting and connection of appropriate circuit elements for electrically coupling or decoupling (hereinafter jointly referred to as "bypassing") the electrical signal on any desired trace to the ground plane, within typically less than an inch from the pin or other contact of the device itself. The connector set assembly of the invention thus overcomes the problems noted above of prior art contact set test assemblies for IC handlers, and also affords numerous advantages not available with contact sets of the prior art. It is therefore is to be understood in the following that the term "bypass" is intended to encompass either electrical coupling or decoupling functions; moreover, reference to "strip line" is for illustrative purposes only, and is not intended to limit the scope of the teachings herein as to the type of controlled impedance transmission line. Moreover, wherever a 50 ohm impedance is typical, it again is exemplary and not limiting.

The above and other features and advantages of the invention will be more readily apparent from the following detailed description of the invention taken in connection with the drawings, as are now summarized.

BRIEF DESCRIPTION OF THE DRAWINGS

FIG. 1 is a schematic representation of a typical feed arrangement for supplying IC devices to a test site as employed in known prior art IC handlers, for illustrating a typical environment in which the contact set assembly of the invention may be employed;

FIG. 2 is a front elevational view of a contact set assembly in accordance with the invention, positioned at a test site, for selectively making contact to the pins of a DIP;

FIG. 3 is a longitudinal elevational view along the line 3—3 in FIG. 2 for illustrating certain details of the contact set assembly of the invention;

FIG. 4 is an enlarged view of a typical connection between the connection board of a tester and the transmission line connector of the contact set assembly of the embodiment of the invention shown in FIG. 2;

FIG. 5 is a perspective view of one embodiment of a strip line connector suitable for use in the assemblies of FIGS. 2 to 4 and illustrating contact probes affixed to connector tabs associated with respective traces of the transmission line connector;

FIG. 6A is a cross-sectional view of a strip line type of transmission line connector, taken illustratively along the line 6A—6A in FIG. 5;

FIG. 6B is an enlarged view of a portion of the structure of FIG. 5 illustrating details of construction affording a bypass connection and the connection of an illustrative bypass element;

FIG. 7A is a cross-sectional view similar to that of FIG. 6A of a composit microstrip transmission line connector in accordance with an alternative embodiment of the invention, which affords Kelvin contact;

FIG. 7B is a cross-sectional view similar to that of FIG. 6A of yet a further alternative embodiment of the transmission line connector of the invention, comprising a strip transmission line;

FIG. 8A is a cross-sectional view of an alternative embodiment of the transmission line connector of the invention employing a button-type probe suitable for use in either DIP or LCC test sites;

FIG. 8B is a cross-sectional view of yet a further alternative embodiment of the transmission line connector of the invention employing transversely mounted contact probes;

FIG. 9 is a front elevational view of an alternative embodiment of a contact set assembly, positioned at a test site and employing an alternative embodiment of a transmission line connector, such as that of FIG. 8B;

FIG. 10 is a perspective view of a dedicated contact set for an LCC test site which employs a transmission line connector having button probes as shown in cross-section in FIG. 8A and an associated PCB connector for connecting the contact set assembly to tester electronics in accordance with the generic teachings of the present invention;

FIG. 11 is an enlarged view of a portion of the contact set of FIG. 10 more fully illustrating the button-type probes and associated traces, with provision for bypass circuit connections adjacent each trace;

FIG. 12 is a cross-sectional view of the contact set assembly of FIG. 10, and an LCC to be received therein for testing;

FIG. 13 is a perspective view of a contact set assembly for an LCC test site which is adjustable to accommodate varying sizes and configurations of LCC devices, and employs a transmission line connector in accordance with the generic teaching of the present invention;

FIG. 14 is an enlarged, partially broken away and exploded view of a portion of the contact set assembly of FIG. 13;

FIG. 15 is a cross-sectional view of a portion of the structure of FIG. 14, taken along line 15—15 in FIG. 14;

DESCRIPTION OF THE PREFERRED EMBODIMENTS

Figure 16:
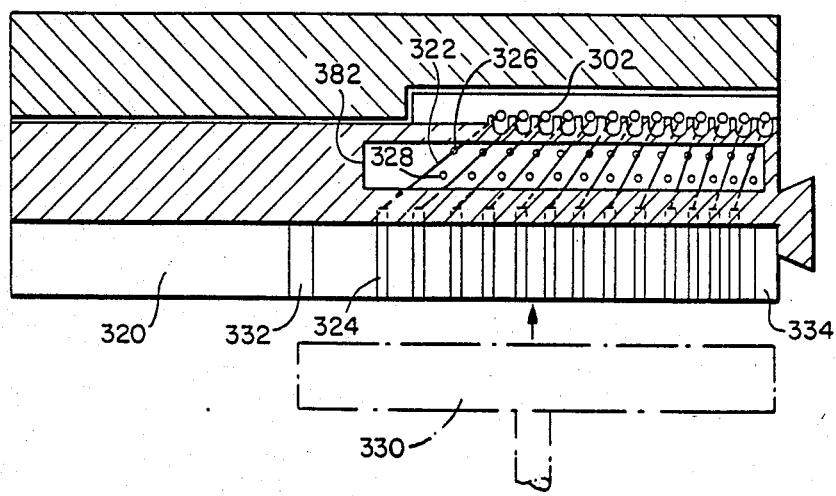
FIG. 16 is a front elevational view, shown partially in cross-section, for illustrating further details of the contact set assembly of FIG. 13, taken along the line 16—16 in FIG. 14.

A first embodiment of the improved contact set assembly in accordance with the present invention, illustrated for a test site for testing DIP's, is shown in FIGS. 2 through 6B to which concurrent reference will be made in the following. In FIG. 2, test site 22' corresponds to the test site 22 associated with the transport mechanism of the prior art handler schematically indicated in FIG. 1. Consistent therewith, a DIP 23' is located at the test site 22' with its connector leads or pins 26 extending in a generally vertically upward direction for ease of access and transport, i.e., the conventional "dead bug" orientation. The DIP 23' is supported on a trough 20' corresponding to the similarly denoted element of FIG. 1.

The contact set assembly 50 employs a transmission line connector 100 shown in more detail in FIG. 5, and functions selectively to engage the contact probes with respectively associated DIP leads 26 and to retract the contact probes from that engaged position in a rapid and accurate manner. The contact set assembly 50 includes a pair of arms 52 and 54 pivotally mounted on a shaft 56 secured to a support 58 and biased by spring 59 to the indicated, normally retracted or open position. The arms 52 and 54 respectively carry head assemblies 60 and 70 which are effectively mirror images of one another. Head assembly 60, by way of example, includes a lower mounting bracket 62 secured to the associated arm 52 and carrying a pin 64 to which actuating shaft 66 of a solenoid 68 is connected. When energized, the solenoid 68 rotates the arm 52 and correspondingly moves the associated head 60 to a contact-engaging position. The associated head assembly 70 correspondingly includes a mounting block 72 and pin 74 with which the shaft 76 of solenoid 78 is associated to effect corresponding movement of the arm 54 and head assembly 70. The solenoids 68 and 78 are simultaneously energized to move the heads 60 and 70 to the contact-engaging positions; when deenergized, the spring 59 retracts the heads 60 and 70 to the open, disengaged position, as shown.

Head assemblies 60 and 70 are shown in somewhat different fashion to illustrate different features which are in fact common to both head assemblies. Particularly, head assembly 60 further includes an upper, clamping block 61 having an internal recess 63, providing space for housing a bypass circuit 80, as later discussed. If desired, the lower, mounting block 62 may include a mating recess 63. Head assembly 70 is illustrated differently, so as to permit disclosure of additional features. Particularly, an alignment pin 73 and a fastner such as a screw 75 are shown, for aligning the upper and lower blocks 71 and 72 and securing same together with the transmission line connector 100 secured, or clamped, therebetween. Preferably, the alignment pin 73 as well is received through a corresponding one of the alignment apertures 102 provided at the extremities of the transmission line connector 100, as better seen in FIG. 5.

As best seen in FIG. 5, the transmission line connector 100 comprises a multi-layer structure of insulating layers and patterned conducting layers including ground planes, signal conductors or traces, and plated-through hole connectors. The transmission line connector 100 can be fabricated in accordance with well known printed circuit or printed wiring techniques. In the embodiments shown in FIGS. 5, 6A and 6B, a central insulating layer 110 has formed on the upper surface thereof a plurality of traces of electrical conducting material 112-1 through 112-n extending from a central portion to the right extremity thereof and a corresponding plurality of traces 113-1, 113-2, ... 113-n extending in generally parallel fashion and aligned with corresponding leads 112-1 through 112-n, respectively, to the left extremity thereof.

Each of the signal leads, or traces, 112-1 through 112-n and 113-1 through 113-n is configured as to width, cross-section, length and type of material (typically copper) so as to afford a desired, controlled impedance (e.g., 50 ohm) transmission line. The traces 112 and 113 respectively terminate at associated plated-through holes 114-1 through 114-n and 115-1 through 115-n, as more readily seen in the cross-sectional view of FIG. 6A. The exterior ends of the traces 112 and 113 are plated with a thin rectangular tab 116-1 through 116-n and 117-1 through 117-n, respectively, as more readily seen in FIG. 6B. Soldered to the surfaces of the tin plated tab connectors 116 and 117 are respective contact probes 118-1 through 118-n and 119-1 through 119-n, as schematically illustrated in FIG. 5 and seen more clearly in FIG. 6A.

Conductive layers 120 and 121 extend substantially continuously from a central portion to respective terminal ends of the transmission line connector 100, insulated from the corresponding signal traces 112 and 113 by the substantially continuous insulating layer 110. The layers 120 and 121 may both be ground planes, or one thereof may be a true ground plane and the other a power ground plane. Preferably, the transmission lines 112 and 113 are overlaid with an insulating layer 103 and the ground planes 120 and 121 are overlaid with an insulating layer 105, for both physical protection and electrical insulation of the associated conductive layers.

Plated-through hole connectors 122-1 through 122-n and 123-1 through 123-n, respectively aligned with the signal traces 112-1 to 112-n and 113-1 to 113-n, extend through the insulating layers and make internal connection to the conductive layers 120 and 121, respectively, as more readily seen in FIG. 6A.

Electrical pin connectors are received in the respective plated-through holes 114, 122, 123, and 115 and soldered or resistance welded thereto to complete connections from the respective traces and the ground planes to a connector board 140 of a tester, as better seen in the enlarged view of FIG. 4.

With concurrent reference to FIGS. 5, 6A and 6B, the latter shows an illustrative bypass circuit element 80' corresponding to the bypass circuit element 80 shown in FIG. 2. The element 80 may provide resistive, capacitive, or inductive electrical characteristics, or a combination thereof, for decoupling or coupling the signal on the associated trace with respect to the continuous conductive layer (ground plane). The provisions in the transmission line connector 100 for connecting such a bypass element comprise plated-through hole connectors 150-1 through 150-n and 151-1 through 151n for the associated traces 112-1 through 112-n and 113-1 through 113-n, respectively; those hole-connectors constitute annular, or donut-like enlargements of the traces as shown for two illustrative traces 151-(n-1) and 151-n in FIG. 6B; the cross-sectional view of FIG. 6A illustrates the plated-through holes 150-n and 151-n connected to the corresponding signal traces 112-n and 113-n. Necessarily, the plated-through holes 150-n and 151-n are insulated from the ground planes 120 and 121 by appropriate aperture-patterning of the latter, insulating material filling the gap between the apertures in the ground plane and the metallic side walls of the plated-through holes 150-n and 151-n.

Additionally, a series of ground-plane plated-through holes 152-1 through 152-n and 153-1 through 153-n are provided in the transmission line connector 100 as better seen with regard to the plated-through holes 153-(n-1) and 153-n in FIG. 6B. These holes, while not shown in the cross-section of FIG. 6A, will be understood to extend through the transmission line connector 100 in spaced and insulated relationship from the respectively associated traces by virtue of being off-set therefrom and to make connection to the ground plane, thus appearing in cross-section in a fashion substantially identical to the ground-plane, plated-through holes 122-n and 123-n in FIG. 6A. As shown in FIG. 6B, the bypass element 80', such as a capacitor, thus establishes an electrical connection from the trace 113-(n-1) through the plated hole 151-(n-1), and to the associated ground-plane 121 through plated-through hole 153-(n-1). It will be understood that in the normal circumstance, only selected traces will be bypassed to the ground-plane by such a bypass circuit element and, particularly, those traces employed as power and ground supply leads to the device under test. The particular traces of course will be selected to be bypassed in accordance with the circuit configuration and thus the pin connections of the DIP selected for testing.

It is to be understood that the illustrated number of traces and associated plated-through holes is not limiting, eight being shown only for purposes of illustration. The width of the transmission line connector 100 and correspondingly the number of traces is designed in accordance with the DIP to be tested. A typical transmission line connector 100 is provided with a sufficient number of connectors and associated traces to accommodate at least several DIP types having a number of pin connectors correspondingly ranging from some predetermined minimum to maximum pin number limit. In practice, it has been found more practical to design several such transmission line connectors 101, each covering a range of DIP sizes, such that a limited number of connectors 100 may accommodate the full range of DIP's to be tested in any given installation.

With concurrent reference to FIGS. 2 and 3, it thus will be appreciated that the head 70 includes in its upper block 71 a recess 63' for mounting bypass circuit elements in a manner identical to that illustrated for the head 60; moreover, the clamping of the terminal ends of the transmission line connector 100 by the respective heads 60 and 70, with the contact probes 118 and 119 projecting toward the DIP pins 26, can be readily visualized. The connectors or probes 118 and 119 preferably are of the above-noted Paliney No. 7 alloy material, which is known to provide excellent electrical contact characteristics and wear resistance and mechanical attachment. The pivotal motion of the heads 60 and 70, when advanced to engage the probes against the DIP connector pins, creates a slight wiping action, enhancing the effectiveness of the electrical circuit connection to the DIP pins. Preferably, the contact ends of the probes are sheared, to create a burr or a sharp tip, which enhances the wiping action and affords improved electrical contact. The transmission line connector 100 itself provides the precise, desired impedance matched characteristic from the tester to the DIP pins themselves, thus affording an electrically "short" signal pattern. Moreover, the bypassing element 80 affords bypassing of the signal on selected traces to the ground-plane, at a position immediately adjacent the tested device itself. The connector 100 also provides enhanced grounding by means of the numerous connector pins 132 and 133 for connection to the tester board 140 and the low inductance metallic planes 120 and 121.

FIGS. 7A and 7B illustrate alternative configurations of transmission line connectors identified as 160 and 170, respectively. Each of FIG. 7A and FIG. 7B is a cross-sectional view through a portion of a transmission line connector as shown in FIG. 6A. In the case of FIG. 7A, there is afforded a ground-plane 120' similar to that of FIG. 6A and a plurality of traces, or conductor lines, only one of which appears in the cross-sectional view, at 112'. The structure of FIG. 7A includes an internal insulating layer 110' and an insulating layer 103' overlaying the trace 112'. A probe 118' corresponding to the probe 118 of FIG. 6A as well is provided, attached to a connector tab 116' of the associated strip conductor 112'. FIG. 7A provides the additional feature of a second transmission line conductor or trace 112a corresponding to each of the overlying strip line connectors 112', symetrically spaced with respect to the ground plane 120' and insulated therefrom by the layer 110', and carrying a corresponding probe 118a'. A further insulating layer 105' overlays the additional, parallel strip line conductor 112a. The composite of two back to back microstrip transmission lines sharing a common ground plane, in the connector 160 of FIG. 7A, thus affords either a general type of Kelvin force sense connection to each pin of the DIP device under test or a parallel redundant signal connection. It is to be understood that plated-through holes for the purposes discussed in relation to FIG. 6A are provided in the structure of FIG. 7A but are not shown, since self-evident.

FIG. 7B comprises a cross-sectional view of yet a further alternative embodiment of a transmission line connector 170 in accordance with the invention, in this instance comprising a strip line. The cross-sectional view reveals a central signal trace or strip line conductor 172 covered on both sides by a suitable insulating layer 174 and having a tab 173 to which a suitable contact probe 176 is affixed. It will be understood that the single conductive trace or signal lead 172 is representative of a plurality thereof in a common plane.

Ground planes 178 and 180 are positioned on opposite sides of the plane of signal trace 172 and insulated therefrom by the insulating layer 174, which further overlays both the ground planes 178 and 180. As in the case of FIG. 7A, suitable plated-through conductors are provided as required for the purposes as before discussed, but are not illustrated since they are self-evident.

FIG. 8A illustrates yet another embodiment of the transmission line connector of the invention. In this instance, the transmission line connector 200 includes upper and lower traces 202 and 204 and a central ground plane 206, and thus is structurally and electrically similar to the connector 160 of FIG. 7A. In FIG. 8A, however, the insulating material 208 extends about the entirety of all the conductor layers, maintaining same in insulated, spaced relationship. A button-type contact probe 110 is secured by soldering or resistance welding to a plated-through hole conductor 212 which makes electrical contact with the signal traces 202 and 204 to provide a Kelvin-type contact, the plated-through hole 212 being electrically insulated by the material 208 from the ground plane 206. A transversely or laterally extending probe or other contact element can be employed in the alternative to button 210.

FIG. 8B illustrates an alternative transmission line connector 220 corresponding substantially to that of FIG. 6A, like parts being denoted by common, but doubly primed numerals as in FIG. 6A. In this instance, however, instead of the laterally extending probe 118-n as used in FIG. 6A, the probe 222 of FIG. 8B is transversely mounted and is electrically connected such as by soldering or resistance welding to a plated-through hole 224 which thus establishes electrical connection between the probe 222 and the signal trace 112''. Again, it will be understood that plural such traces and associated probes, plated-through holes and the like are afforded in the structure of FIG. 8B consistent with the prior-described structures herein.

FIG. 9 is an elevational view of a contact set assembly 50'' employing a transmission line connector 220'' which may be of any of the types heretofore described which can accommodate transversely mounted probes, and particularly the connector 200 of FIG. 8A or the connector 220 of FIG. 8B, respectively having transversely mounted button probes 210 and elongated probes 222. For purposes of illustration and not limitation, the transmission line connector 220 of FIG. 8B is shown at 220'', as mounted in the mechanism 50'' of FIG. 9. In this configuration, the heads 60'' and 70'' are carried directly on the actuating shafts 66'' and 76'' of the associated solenoids and engage the terminal ends of the transmission line connector 220'' to impart substantially linear, reciprocating motion to the probes 222a and 222b for causing same to engage the upstanding contact pins 26'' of the DIP 23'' supported on the track 20'' at the test site of the handler. The angle of engagement is selected to provide a wiping action. The connection to a board 140'' from the traces of the transmission line connector 220 may be as shown in FIG. 4.

FIG. 10 is a perspective view of a dedicated contact set assembly for an LCC test site, employing a transmission line connector 240, the latter incorporating the generic teachings of the present invention. The specific contact set assembly is disclosed and claimed in the above-noted concurrently filed application. Traces 242 interconnect button probes 244 with corresponding connector tabs 246 disposed on the four orthogonally related extensions of the element 240. A typical PCB (printed circuit board) type connector 250 carries contact elements for engaging the tabs 246, one such PCB connector 250 being provided for each of the four connector extensions of the element 240. Alternatively, the traces on one extension may be extended to a different extension for common connection with the traces of that extension by an enlarged, single PCB connector.

With reference to FIG. 11, a portion of the element 240 is shown in greatly enlarged scale to reveal that it is partitioned into separate fingers 240-1, 240-2, . . . each thereof carrying a corresponding trace 242-1, 242-2, . . . terminating in an associated button type probe 244-1, 244-2 . . . respectively. Plated-through holes 243-1, 243-2, . . . are respectively formed in the conductor traces and plated-through, ground plane connector holes 245-1, 245-2, . . . are provided for bypass connections as hereinbefore described. The separate fingers 240-1, 240-2, . . . carrying corresponding traces enable the inherent flexibility of the material of the connector 240 to afford resilient engagement of the button probes 244 with the mating, aligned contacts of an LCC as shown at 270 in FIG. 12. If desired, an elastomeric layer 241 may be formed on the lower surface of the connector 240 to improve rigidity while maintaining flexibility of the individual fingers. In FIG. 12, the connector 240 is illustrated as supported in a housing, or head assembly 260 having a base support element 261 and a mating, clamping element 262. An alignment pin 264 extends between the elements 261 and 262 and may extend through the connector 240 for alignment purposes, the structure being secured by suitable screws 266 which preferably extend only between the upper and lower support elements 262 and 261, respectively. The relative position of the PCB connector 250 is indicated as well in FIG. 12, along with a corresponding such connector 252. The support 260 is further illustrated in the right hand part of FIG. 12 to include a recess 280 for mounting a bypass circuit element 282 for purposes as hereinbefore described.

The upper element 262 includes an interior perimeter, beveled edge 262a to facilitate alignment of the LCC 270 as it is moved into the test position within the assembly 260. The interior edge 261a of lower support element 261 is beveled, or relieved, to permit deflection of the digitated fingers 240-1, 240-2, . . . of the connector 240 to assure uniform electrical contact between the button-type probes 244 and the respective connector tabs of the LCC 270.

It is to be understood that the connector and associated support structure shown in FIGS. 10 through 12, while dedicated, is not restricted to the size or configuration shown, but can be designed to accommodate any desired configuration, size, and number of contacts of a device to be tested. Industry practice currently has established a standardized spacing of LCC contacts of either 40 mils or 50 mils, the latter being more common. Accordingly, the spacing of the button probes 244 is made to correspond to that of the contacts of the LCC, both as to number and spacing. It will also be appreciated that the digitated fingers of the flexible connector 240 affords a wiping action against the contacts of the LCC 270 as it is pushed downwardly onto the button probes 240, thereby enhancing the electrical contact. A vacuum chuck 401 provides for placement of the LCC 310 onto the assembly 300 and for removal therefrom after the test is completed.

FIG. 13 illustrates a further LCC contact set assembly employing a contact set incorporating the generic teachings of the present invention, and which employs adjustable components to accommodate any of a wide range of LCC devices, as to size and configuration and number of contacts. The subject matter of FIG. 13 and related FIGS. 14 to 19 is disclosed and claimed in the above-referenced concurrently filed application. The adjustable LCC contact set asembly of FIG. 13 is shown in a fragmentary, partially broken-away and exploded view in FIG. 14, and in cross-section in FIG. 15 taken along the line 15—15 in FIG. 14. FIG. 16 is a front elevation of one of the head assemblies of FIG. 13 and particularly as taken along the line 16—16 in FIG. 14. With concurrent reference thereto, the probes 302 are of an "L" configuration, as viewed in a vertical plane, with the short leg of the "L" pointing upwardly to receive and make contact with a corresponding contact of the LCC 310 as the latter is lowered into position in the test assembly. The probes 302 are mechanically secured to a strip line connector 320 in corresponding plated-through holes which afford electrical connection to line conductors, or traces, formed on the connector 320 in accordance with any of the embodiments afore-described.

As most readily seen in the perspective view of FIG. 13, the adjustable contact set assembly 300 comprises a first head component 350 secured to a support base 400 and associated head components 352, 354 and 356, all of which are interconnected in a sliding, adjustable manner by suitable dovetail or other joints. The dovetail joints as illustrated at 353 interconnecting the head assembly components 350 and 352, and at 355 interconnecting the head assembly components 350 and 356 provide for rectilinear, transverse movement of the components 352 and 356 relative to the fixed head assembly component 350. Components 352 and 356 are correspondingly connected to component 354 by dovetail joints (hidden from view in FIG. 13) so as to permit corresponding, relative movement. Thus, adjustment of the opening defined between the components 350, 352, 354 and 356, and the number of contact probes 302 which are exposed is made, as desired, to accommodate any configuration or size of an LCC 310 to be tested.

A transmission line connector 320 is associated with each of the head components 350, 352, 354 and 356. Each transmission line connector 320 includes transmission strip line traces 322 interconnecting each probe 302 with a corresponding tab 324 which may be plated as in the previously described embodiments. Suitable plated-through connector holes 326 and ground-plane, plated-through holes 328 are provided in association with each trace 322 for connection of bypass elements, as previously described. Further, a PCB-type connector 330 is engaged with the edge of the strip line connector 320, for which purpose open, receiving slots 332 and 334 are provided, to make electrical contact with the tabs 324.

In FIG. 15, the head assembly component 352 is shown in an enlarged cross-sectional view; it is understood that the remaining head assembly components are correspondingly configured. The component 352 includes a main base element 360 a clamping base element 362 having the female recess of the dovetail 353 formed therein. The upper surface of the base component 362 includes grooves 364 for nestling the lower edges of the probes 302 in the region immediately adjacent the transmission line connector 320, for each of the probes 302, and relieved (e.g., inclined) slots 366 underlying each probe 302, of an overall depth relative to the nominal horizontal position of the probe 302 which is equal to the height of the short, upwardly projecting leg of the "L" probe. Finally, the upper element 368 of the head 352 includes a depending projection 368a received in an alignment channel 368b of the base 360 for accurate positioning relative to the base elements 360 and 362. The three elements are suitably secured together by securing means 380 and 382, such as screws received in the corresponding threaded holes. The upper element 368 further includes a slanted or beveled interior edge 369 to facilitate alignment of the LCC 310 as it is received within the test site, to assure overall alignment of the contacts thereof with the probes 302. As will be apparent, the support 400 includes appropriate apertures as are illustratively shown at 452, 410 and 420 for receiving corresponding PCB connectors therethrough and into engagement with the contact tabs of the associated strip line connectors 320 of the respective head assembly components. A suitable transport mechanism, such as a vacuum chuck 401', positive the LCC 310 onto the probes 302, exerting a slight downward force to assure good electrical contact therewith, and as well provides for removal of the LCC 310 from the contact assembly upon conclusion of testing.

It will be appreciated that the adjustable LCC test site assembly of FIGS. 13 through 16 affords substantially unlimited adjustment as to size and number of contacts of LCC devices 310 to be tested, and thus provides for substantial flexibility in accommodating a wide variety of LCC devices, yet providing secure and accurate electrical contact. Again, the flexible probes 302 provide a wiping action to enhance the electrical connection with the corresponding contacts. As shown in FIGS. 15 and 16, recess 382 provided in the base component 362 permits mounting of a bypass circuit device 384 between the plated-through connectors 326 and 328 for bypassing any selected transmission line trace 322.

Figure 17:
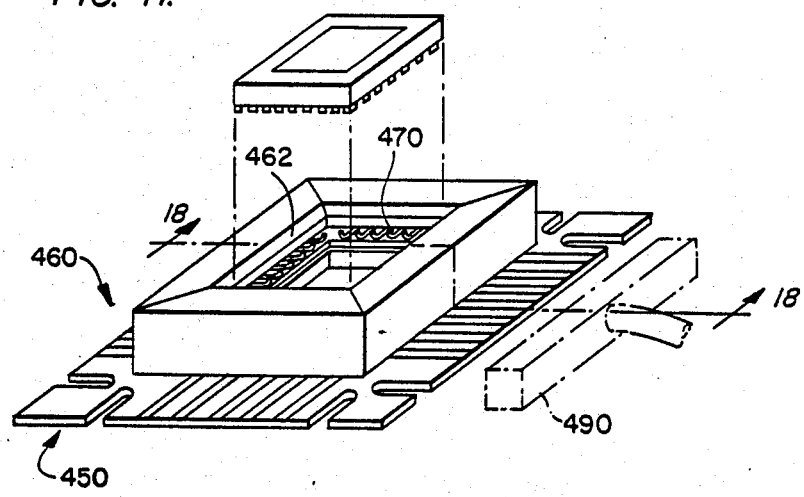
FIG. 17 is a perspective view of a dedicated contact set assembly for an LCC test site, and further illustrating a PCB type connector for a corresponding branch or segment of the connector set.
Figure 18:
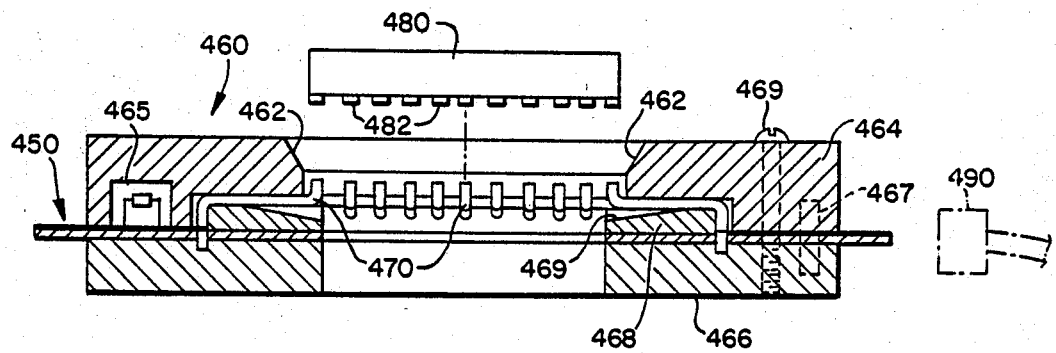
FIG. 18 is a cross-sectional view of the structure of FIG. 17 taken along the line 18—18 in FIG. 17.

FIG. 17 comprises a perspective view of a further embodiment of a contact set assembly 460 for a dedicated LCC test site, further details of which are shown in the cross-sectional view of FIG. 18 taken along line 18—18 in FIG. 17. In this embodiment, a transmission line connector 450 is suitably aligned within and supported by a head assembly 460 so as to position Z-shaped contact probes 470 for engaging and making electrical contact with an LCC 480 when the same is moved into position at the test site. The alignment of the various contact probes 470 with contacts 482 of the LCC 480 is facilitated by the beveled interior edges 462 of the upper, clamping block 464 of the assembly 460. FIG. 18 shows an optional base support 466, and an interior element 468 which may be part of the head 460 or alternatively may be formed on the connector 450 and positioned beneath the Z-shaped probes 470. Element 468 includes a plurality of recesses or channels 469 aligned with respective probes 470 and which are generally horizontal immediately adjacent the vertically extending leg of the probe affixed to the connector 450, and then are relieved (e.g., inclined downwardly) as they progress toward the interior perimeter of the assembly 460. In this instance, the resilience of the probes 470 permits slight deflection thereof when the LCC 480 is moved into position for testing, thereby to assure reliable electrical contact of the probes 470 with the associated contacts 482 of the LCC 480. If desired, the provisions of channels prevents the probes from being overdriven, and thus protects them from damage. Element 468 may be secured directly to block 464 and the block 466 eliminated.

The upper, clamping block 464 includes a recess 465 for receiving a bypass circuit (not shown) as hereinbefore described. Likewise, suitable alignment pins 467 and securing means such as screw 469 are provided for alignment of the connector 450 and the head components, and to secure the upper block 464 with the lower block 466 of the assembly 460.

The transmission line connector 450 includes suitable transmission line signal conductors or traces, plated-through holes for mechanical and electrical connection of the probes 470, and suitable bypass circuits and the like; the specific configuration thereof may be in accordance with any of the hereinabove disclosed strip line connectors. The structure of FIGS. 17 and 18 thus is similar to that of FIGS. 13-16 in the sense they both utilize the numerous advantages of the transmission line connector of the invention while employing primarily the resiliency of the probes, preferably of Paliney No. 7 wire, to assure proper engagement and electrical contact with the contacts of the LCC as received in the test site. FIG. 18 is suitable for applications requiring convenient accessibility in a lateral plane to the connector tabs of the transmission line connector 450, as illustrated by the printed circuit board connector 490 seen in each of FIGS. 17 and 18.

Figure 19:
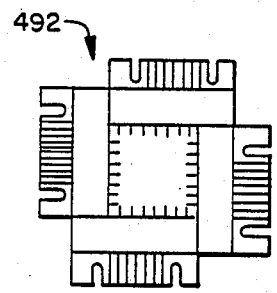
FIG. 19 is a simplified planar view of an adjustable contact set assembly for an LCC test site employing segmented transmission line connectors and associated pin-type probes, similar to the embodiment shown in FIGS. 17 and 18.

FIG. 19 is a simplified plan view of an adjustable LCC test site assembly. In this instance, the support head 492 is formed of separate components having provision for sliding engagement with respect to each other, such as the dovetail joints of the assembly 300 shown in FIG. 13. Correspondingly, there are employed four segmented transmission line connectors, each configured and structured as any one of the sides or ends of the transmission line connector 450 of FIGS. 17 and 18, to permit adjustment of the respective four components of the head assembly. Thus, the structure of FIG. 19 incorporates the features of the dedicated structure of FIGS. 17 and 18, while being adjustable to accommodate LCC's of differing sizes, configurations, and number of contacts.

Figure 20A:
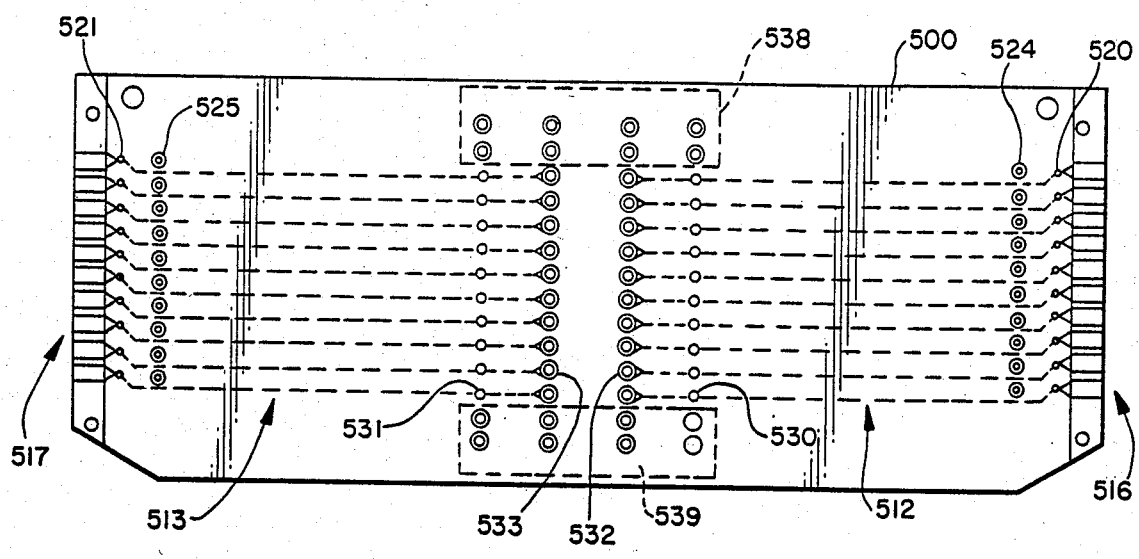
FIGS. 20A and 20B are top and bottom plan views, respectively, of an alternative embodiment of the transmission line connector of the invention, similar to that of FIG. 5.
Figure 20B:
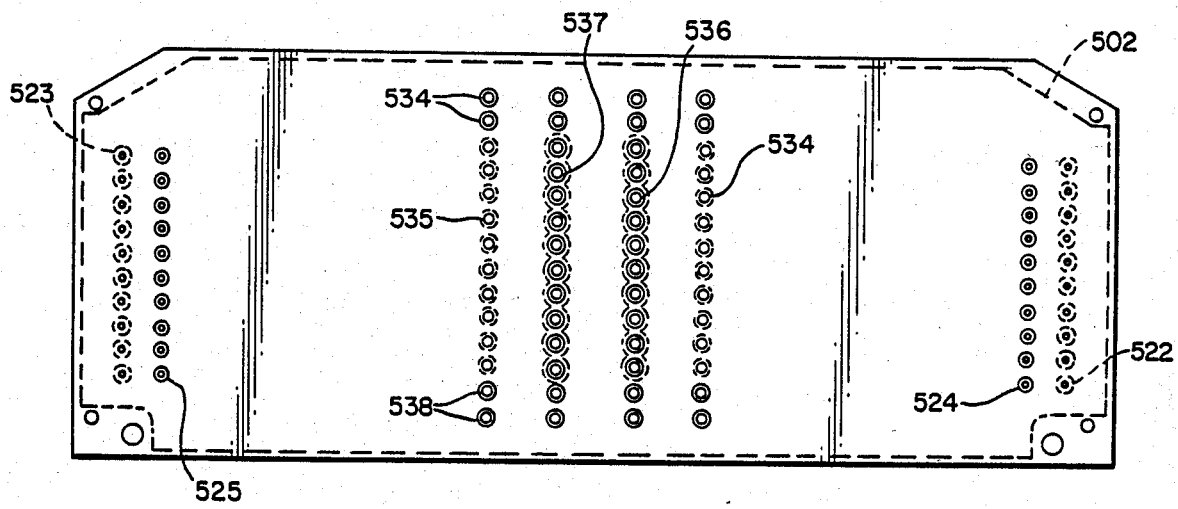

FIGS. 20A and 20B are top and bottom plan views, respectively, of a transmission line connector 500 in accordance with the present invention, and which is similar in many features to that of FIG. 5. A detailed understanding of the basic arrangement of traces, connector tabs, plated-through holes for bypass circuit connections and the like therefore can be obtained by reference to the discussion of FIG. 5. Accordingly, only the significant differences in this embodiment are addressed here.

As best seen in FIG. 20B, the transmission line connector 500 of FIGS. 20A and 20B incorporates a continuous ground plane 502 uniformly spaced in insulated relationship from the right and left hand sets of aligned, parallel traces 512 and 513, respectively. The individual traces 512 and 513 include associated tabs 516 and 517, respectively, to which suitable probes (not shown) are respectively attached. Adjacent the tabs and near the remote ends of the respective traces 512 and 513 are a series of plated-through connector holes 520 and 521 for the associated traces, the plated holes extending in insulated relationship through enlarged openings in the ground plane indicated, for example, by the enlarged openings 522 and 523 in FIG. 20B. In similar fashion as in FIG. 5, plated-through holes 524 and 525 extend through the insulating layer into electrical contact with the continuous ground plane 502, thus affording a terminal for connection of an electrical bypass element with respect to any selected trace.

The transmission line connector 500 of FIGS. 20A and 20B affords a type of Kelvin connection by the provision of dual plated-through holes electrically connected to the interior terminal ends of the respective traces as indicated at 530, 531, 532 and 533 in FIG. 20A, FIG. 20B indicating the enlarged apertures 534–537 in the ground plane 502 through which the respective plated-through holes 530–533 proceed and from which they are insulated. Electrical connection to the ground plane is provided by four pairs of plated-through holes 538 and four pairs of plated-through holes 539, which pairs are respectively aligned with the plated-through connector holes 534 to 537 associated with the traces 512 and 513.

Accordingly, whereas the split or dual ground plane configuration of the transmission connector of FIG. 5 affords the advantage that one ground plane may be a true ground plane and the other a power ground plane, the continuous ground plane of the embodiment of FIGS. 20A and 20B affords the advantages of a uniform ground plane and a Kelvin-type contact.

Numerous materials may be suitable for fabrication of transmission line connectors in accordance with the teachings of this invention. Thus, Beryllium copper may be employed in lieu of elemental copper for the traces. Tin or other good conductive material is appropriate for forming the connector tabs associated with the traces; the tabs are not highly subject to wear, but must provide good conductivity.

A preferred insulating material is a polymide film such as Kapton, Type F film. a product of E. I. du Pont de Nemours & Company. Numerous thin film dielectrics are suitable, and, depending on thickness, may be flexible or rigid. G-10 fiberglass is a suitable rigid material; epoxy glass may be used for either flexible or rigid applications. Tetrafluoroethylene (TFE) and Teflon ® thin films are also useful. When used as a center layer, thickness of 0.005 inch is appropriate for the insulative layer 110, as in FIG. 6A; a thickness of 0.001 inch is appropriate for the cover layers 103 and 105.

Typical dimensions of the traces include a thickness of 0.015 inch and a width of less the spacing therebetween of 0.100 inch, depending on the impedance requirement. In forming traces, a 2 oz. copper foil, fully annealed, may be employed, suitably masked and etched by conventional PCB processes. Connector tabs, such as 117n (FIG. 6B) may be gold plated or tin plated, to a typical thickness of 10 microinches. The Paliney No. 7 ® probes may be 0.019 to 0.020 inches in diameter, and typically less than an inch in length.

The connector, or solder, holes may be coated to a thickness of 0.001 inch with copper. Plated connector holes such as 151n may be on the order of 0.018 inch diameter in the trace 113n and about 0.041 inches in the insulating layer: ground plane connector holes such as 153n for the bypass circuits may be similarly dimensioned. The ground plane connector holes such as 123n may be 0.032 inch diameter in the ground plane and 0.055 inch diameter through the insulating layers. The trace terminal connector holes such as 115n in FIGS. 5 and 6A, and 531 and 533 in FIGS. 20A and 20B may be 0.032 inches diameter in the ground plane and 0.041 inches diameter in the insulating layers.

It is significant in the selection of materials for the insulator, the traces, and the contact probes, that environmental and mechanical wear conditions be taken into account. For example, handlers having heating and cooling systems for environmental testing of devices impose thermal operating conditions ranging from $-60°$ C. to $+160°$ C.

Flexibility of the insulating material is important to various of the transmission line connectors of various embodiments of the invention as herein disclosed. Thus, flexibility is important to the device shown in FIG. 5 wherein the transmission line connector affords a highly convenient means of accommodating the reciprocating actuation of the movable head mechanism to achieve selective contact with the DIP pins at high cycle rates (e.g., testing of 10,000 to 12,000 devices per hour on a continuing basis). A significant attribute of the transmission line connector in this application, is that it maintains a constant length of transmission line between the device and the tester board, despite the requirement for relative movement therebetween, yet introduces no further connection requirements and instead maintains a permanent connection between the tester board and the probes which actually contact the DIP connector pins. Flexibility is also important for the same reasons in the embodiment of FIG. 9. Flexibility is important in the embodiment of FIG. 10 since the transmission line connector itself affords the resilient biasing action of the button probes against the contacts of an LCC when moved into the test site.

The embodiments of FIGS. 13–19, on the other hand, may employ an insulating support material which is either flexible or inflexible, since in these embodiments, the contact probes themselves afford the resilient biasing for engaging the contacts of an LCC moved into the test site for testing. The device of FIGS. 20A and 20B, of course, is primarily intended for use in an embodiment such as that of FIGS. 2 and 9 and accordingly flexibility is a desired attribute of this device as in the case of the device of FIG. 5.

It will be appreciated from the foregoing that significant improvements in the circuit encompassing the "device to test-head contact" have been achieved by the contact set assembly of the invention in any of its various embodiments. All thereof use to advantage the controlled impedance of the transmission line connector to maintain a desired, e.g., 50 ohm, impedance from the tester directly to the pins or contacts of the devices under test. All of the embodiments provide for bypass connections, and each contact set assembly has specific provision to accommodate and house bypass elements connected to any desired trace, immediately adjacent the device. Both dedicated and adjustable test site assemblies for DIP and for LCC devices employing a variety of transmission line connectors in accordance with the invention are provided.

In addition to the foregoing, numerous other adaptations and modifications of the invention will be apparent to those of skill in the art, and thus it is intended by the appended claims to cover all such modifications and adaptations as fall within the true spirit and scope of the invention.

We claim:

1. Apparatus for selectively making electrical contact between contacts of a contact set assembly and contact elements of an electrical device to be engaged thereby, comprising:

said contacts set assembly, wherein said assembly includes:

(i) a flexible insulating layer having opposed, substantially parallel first and second surfaces and first and second spaced edges; and (ii) a plurality of controlled impedance conductive lines disposed generally parallelly on said first surface in laterally spaced relationship, each of said lines having a first terminal portion adjacent said first edge of said insulating layer and a second terminal portion remote from said first terminal portion;

first means for selectively flexing said insulating layer with said controlled impedance conductive lines disposed on said first surface thereof, to urge said first edge toward said second edge;

second means providing electrical connections to said second terminal portions of said lines; and third means for introducing an electrical device to be contacted into a station between said first and second edges, wherein, as said first means flexes said insulating layer, contact elements of an electrical device in said station are engaged by said first terminal portions.

2. Apparatus as recited in claim 1 wherein said first means comprises a solenoid actuator and means linking said actuator to said contact set assembly.

3. Apparatus as recited in claim 1 wherein said contact set assembly further includes a flexible, substantially continuous conductive layer overlying and secured to said second surface of said insulating layer.

4. Apparatus as recited in claim 3 wherein said connector further comprises:

a first insulating cover layer disposed on said plurality of conductive lines, and a second insulating cover layer disposed on said substantially continuous conductive layer.

5. Apparatus as recited in claim 4 wherein:

said first insulating cover layer covers substantially the entirety of said conductive lines with the exception of said first terminal portions thereof, said second insulating cover layer covers substantially the entirety of said substantially continuous conductive layer, and said means connected to said second terminal portions of said lines comprises plated-through hole connectors extending through said insulating layers, through and selectively connected to respective, said second terminal portions of said lines, and through and insulated from said continuous conductive layer.

6. Apparatus as recited in claim 5 wherein there is further provided at least one plated-through hole connector extending through said insulating layers into electrical contact with said continuous conductive layer and in spaced and insulated relationship from said plurality of conductive lines for providing an electrical connection to said substantially continuous conductive layer.

7. Apparatus as recited in claim 6 wherein there is provided a plurality of said plated-through hole connectors in electrical contact with said conductive layer.

8. Apparatus as recited in claim 6 wherein there is further provided a plurality of said plated-through hole connectors connected to said conductive layer closely adjacent respectively corresponding said first terminal portions of said plurality of lines, and there is further provided:

a plurality of plated-through hole connectors extending through said insulating layers, and through and electricaly connected to respective, said plurality of conductive lines adjacent said first terminal portions thereof, each said line hole connector and associated conductive layer hole connector adjacent said first terminal portion of a respective said line affording circuit connections for selectively connecting electrical circuit elements between respective, said lines and said conductive layer.

9. Apparatus as recited in claim 8 wherein said electrical circuit elements selectively couple the selected, respective said lines to said conductive layer.

10. Apparatus as recited in claim 8 wherein said electrical circuit elements selectively decouple the selected respective, said lines from said conductive layer.

11. Apparatus as recited in claims 3, 4, 5, 6, 7 or 8 wherein:

said insulating layer is of an elongated configuration having first and second extreme end edges spaced apart by the elongated dimension thereof;

said plurality of conductive lines comprises first and second pluralities thereof, corresponding lines of said first and second pluralities extending in generally aligned and parallel relationship with said elongated dimension, said first and second pluralities of lines having said first terminal portions thereof adjacent said corresponding first and second extreme end edges of said insulating layer, and said second terminal portions thereof adjacent a central portion of said insulating layer and spaced apart in insulated relationship, and said substantially continuous conductive layer comprises first and second conductive layers respectively associated with said first and said second pluralities of conductive lines.

12. Apparatus as recited in claims, 3, 4, 5, 6, 7 or 8 wherein:

said insulating layer is of an elongated configuration having first and second extreme end edges spaced apart by the elongated dimension thereof;

said plurality of conductive lines comprises first and second pluralities thereof, corresponding lines of said first and second pluralities extending in generally aligned and parallel relationship with said elongated dimension, said first and second pluralities of lines having said first terminal portions thereof adjacent said corresponding first and second extreme end edges of said insulating layer, and said second terminal portions thereof adjacent a central portion of said insulating layer and spaced apart in insulated relationship, and said substantially continuous conductive layer extends substantially throughout the elongated said insulating layer forming a voltage reference plane for both said first and said second pluralities of conductive lines.

13. Apparatus as recited in claims 3, 4, 5, 6, 7 or 8 wherein:

said first providing means comprises conductive probes connected to respective said first terminal portions of corresponding ones of said lines.

14. Apparatus as recited in claim 9 wherein said conductive probes are sheered on the free ends thereof to afford and enhanced wiping action when engaging electrical contacts of a device to be tested.

15. Apparatus as recited in claims, 3, 4, 5, 6, 7 or 8 wherein:
said second means connected to said second terminal portions of said lines comprises conductive pins electrically connected to respective said second terminal portions of corresponding ones of said lines and insulated from said substantially continuous conductive layer.

16. Apparatus as recited in claim 3 further comprising:
a further insulating layer generally co-extensive with said first insulating layer, and having first and second surfaces and first and second displaced end edges with said second surface thereof disposed on said continuous conductive layer,
a second plurality of controlled impedance conductive lines positioned in substantially parallel-spaced, insulated relationship on said first surface of said second insulating layer and having first terminal portions adjacent said first edge of said second insulating layer and second terminal portions remote from said first terminal portions.

17. Apparatus as recited in claim 16 wherein:
said first providing means comprises conductive probes connected to respective said first terminal portions of corresponding ones of both said first and second pluralities of conductive lines to afford a Kelvin-type contact.

18. Apparatus as recited in claim 16 wherein:
said first means provides selective and independent electrical contact between said contact elements of an electrical device and respective said first terminal portions of corresponding ones of said first and said second pluralities of lines, and
said second means provides independent electrical connections to said second terminal portions of said first and second plurality of lines.

19. Apparatus as recited in claim 16 wherein:
said first providing means comprises first and second pluralities of conductive probes respectively connected to said first terminal portions of said first and said second pluralities of conductive lines.

20. Apparatus as recited in claim 16 wherein:
said second plurality of controlled impedance conductive lines is aligned in oppositely disposed relationship with respective said first plurality of controlled impedance conductive lines,
said first means provides selective electrical contact between said contact elements of an electrical device and the respective, said first terminal portions of both said oppositely disposed first and second pluralities of lines, and
said second means provides respective electrical connections to the respective, said second terminal portions of both said oppositely disposed first and second pluralities of lines.

21. Apparatus as recited in claims 3 or 16 wherein each said probe comprises a wire-like element connected mechanically and electrically to said first terminal portion of its corresponding said conductive line, extending beyond the associated said terminal end edge of said insulating layer.

22. Apparatus as recited in claims 3 or 16 wherein each said probe comprises a button type contact connected to a plated-through hole extending through said insulating layers, through respective said conductive lines in electrical connection therewith, and through and insulated from said continuous conductive layer, adjacent said first terminal edge of said insulating layer and extending transversely of said insulating layer.

23. Apparatus as recited in claims 3, 4 or 16 wherein each said insulating layer is formed of a flexible insulating material.

* * * * *